(12) United States Patent
Wang et al.

(10) Patent No.: US 6,583,447 B2
(45) Date of Patent: Jun. 24, 2003

(54) MULTIPLE LED CHIP PACKAGE

(75) Inventors: Bily Wang, Hsin-Chu (TW); Bill Chang, Hsin-Chu (TW); Yann Lee, Hsinchu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/940,152

(22) Filed: Aug. 27, 2001

(65) Prior Publication Data

US 2003/0038292 A1 Feb. 27, 2003

(51) Int. Cl.[7] ...................... H01L 33/00; H01L 31/0232
(52) U.S. Cl. ........................... 257/99; 257/81; 257/703; 257/713; 257/724

(58) Field of Search ................................. 257/703, 713, 257/724, 99, 81

(56) References Cited

U.S. PATENT DOCUMENTS

| | | | | |
|---|---|---|---|---|
| 6,060,729 A | * | 5/2000 | Suzuki et al. | 257/100 |
| 6,180,962 B1 | * | 1/2001 | Ishinaga | 257/100 |
| 6,281,524 B1 | * | 8/2001 | Yamamoto et al. | 257/99 |

* cited by examiner

Primary Examiner—Jerome Jackson
(74) Attorney, Agent, or Firm—H. C. Lin

(57) ABSTRACT

A surface-mount package for multiple LED chips is constructed by inscribing a groove in an insulating substrate. The LED chips are mounted in the groove and the leads are connected to metal plates, which wrap around the substrate to provide bottom contacts for surface-mounting.

8 Claims, 16 Drawing Sheets

MULTIPLE LED CHIP PACKAGE

BACKGROUND OF THE INVENTION (1) Field of Invention

This invention relates to light emitting diodes (LED), particularly to packages for multiple LED chips. The package is also applicable to optical devices, such as laser diodes, etc.

(2) Brief Description of Related Art

FIG. 1 shows a prior art package for a single LED. A cup 16 is recessed in a substrate 15. The bottom and the wall of the cup is coated with a layer of metal 11. The LED chip 10 is mounted on the bottom of the cup 16. The top electrode of the LED chip 10 is wire-bonded to the metallic plate 12 for extension connection. The bottom electrode of LED 10 is in contact with the metallic layer 11 which is extended to provide another external connection. FIG. 2 shows the side view of FIG. 1.

The cup shaped structure shown in FIGS. 1 and 2 has only one cup and is incapable of accommodating multiple number of chips in one package.

SUMMARY OF THE INVENTION

An object of this invention is to provide a package capable of packaging multiple number of LED chips.

The object is achieved by inscribing a groove in the package so that more than one LED chips can be mounted in the groove.

DETAILED DESCRIPTION OF THE INVENTION

Figure 1:
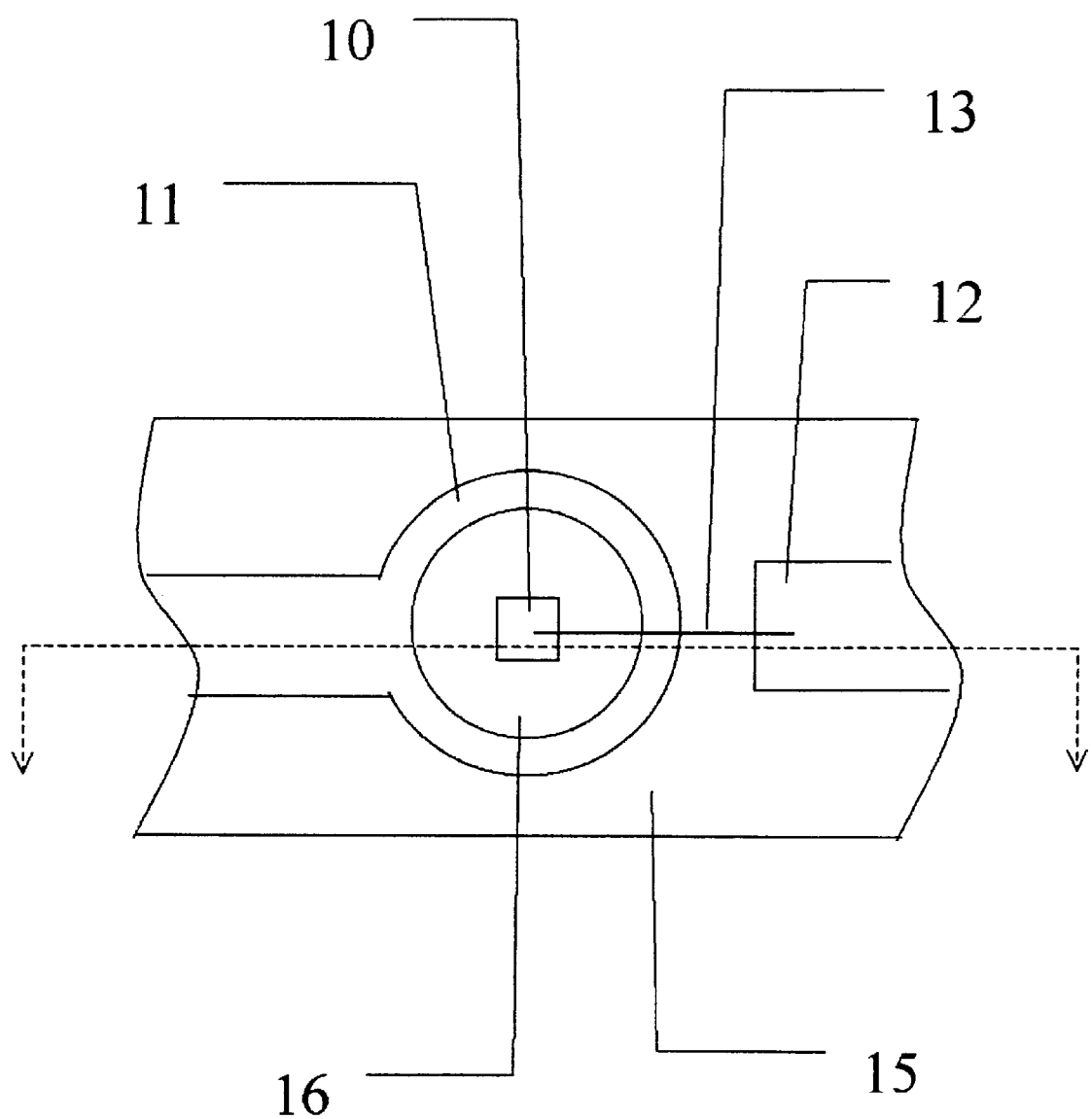
FIG. 1 shows the top view of a prior art LED package.
Figure 2:
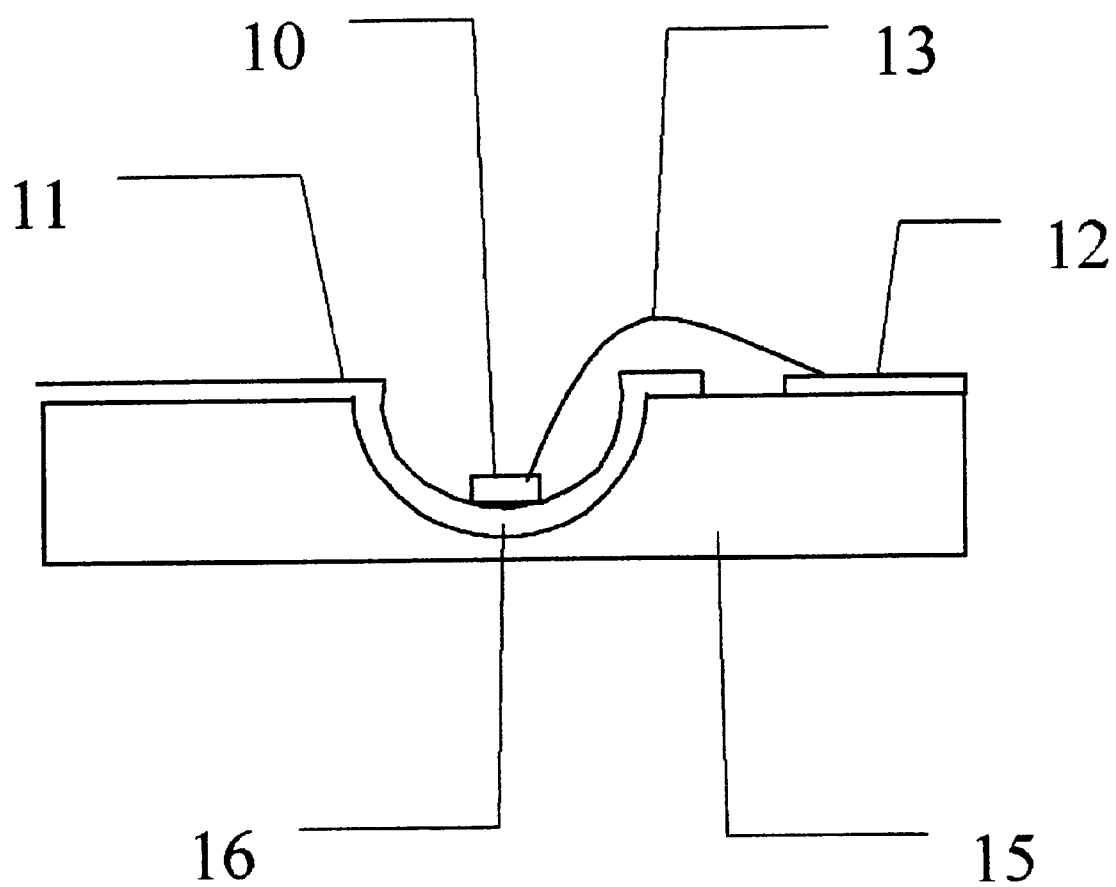
FIG. 2 shows the side view of FIG. 1.
Figure 3:
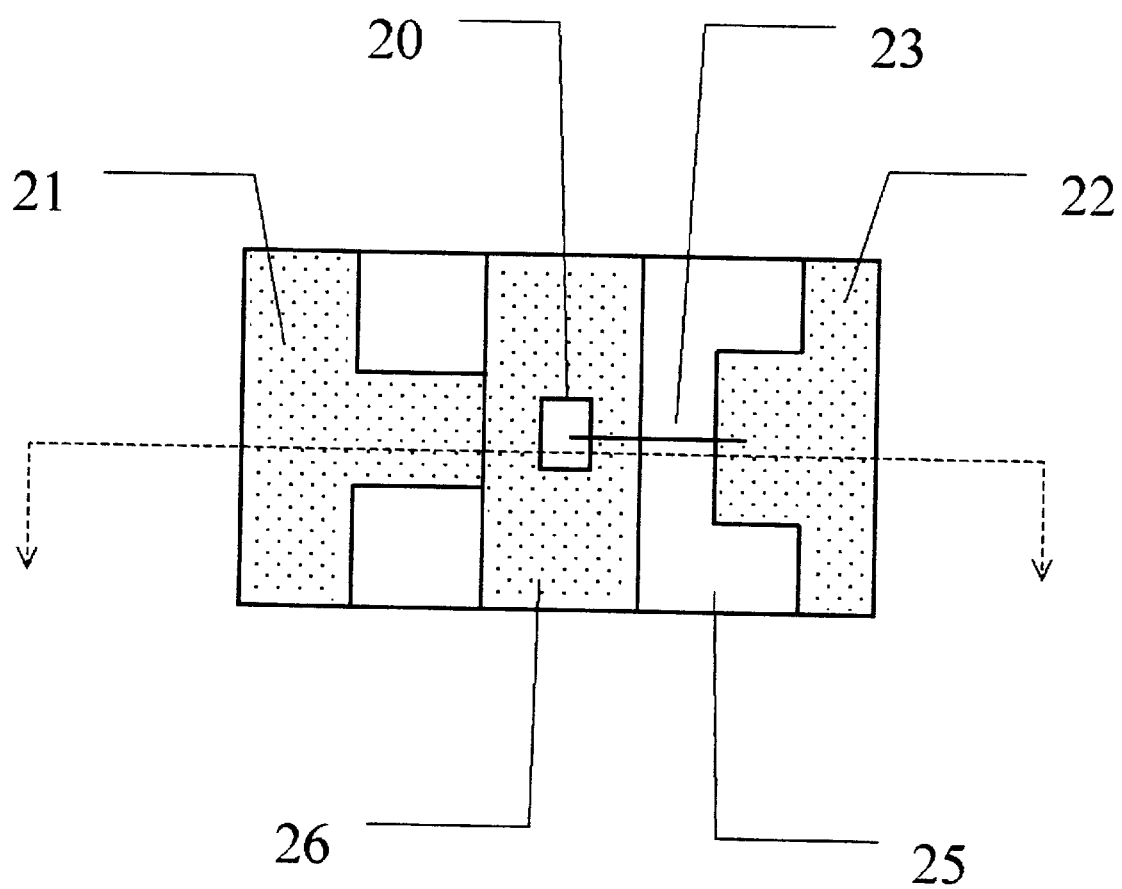
FIG. 3 shows the top view of the grooved package of the present invention.
Figure 4:
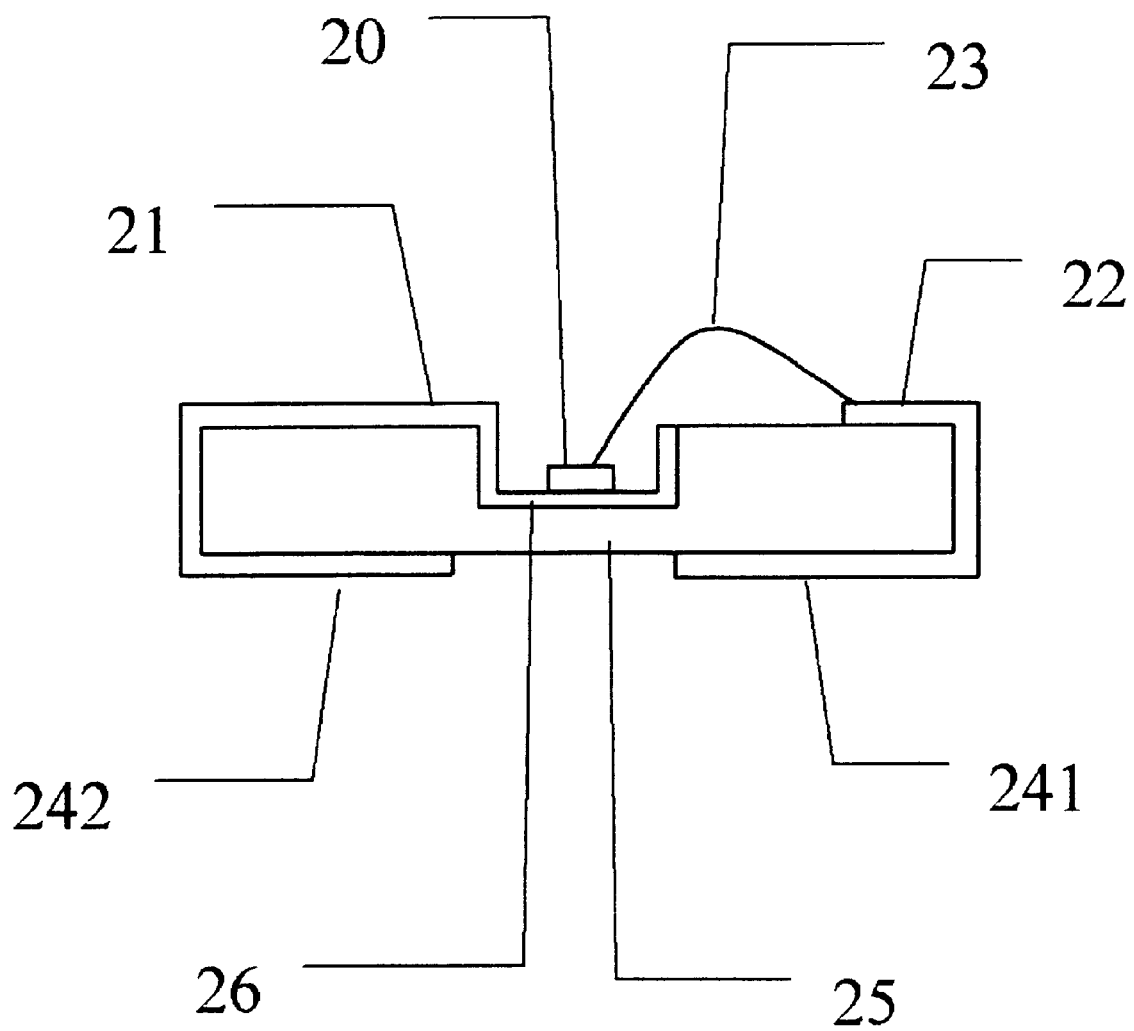
FIG. 4 shows the side view of FIG. 3.
Figure 5:
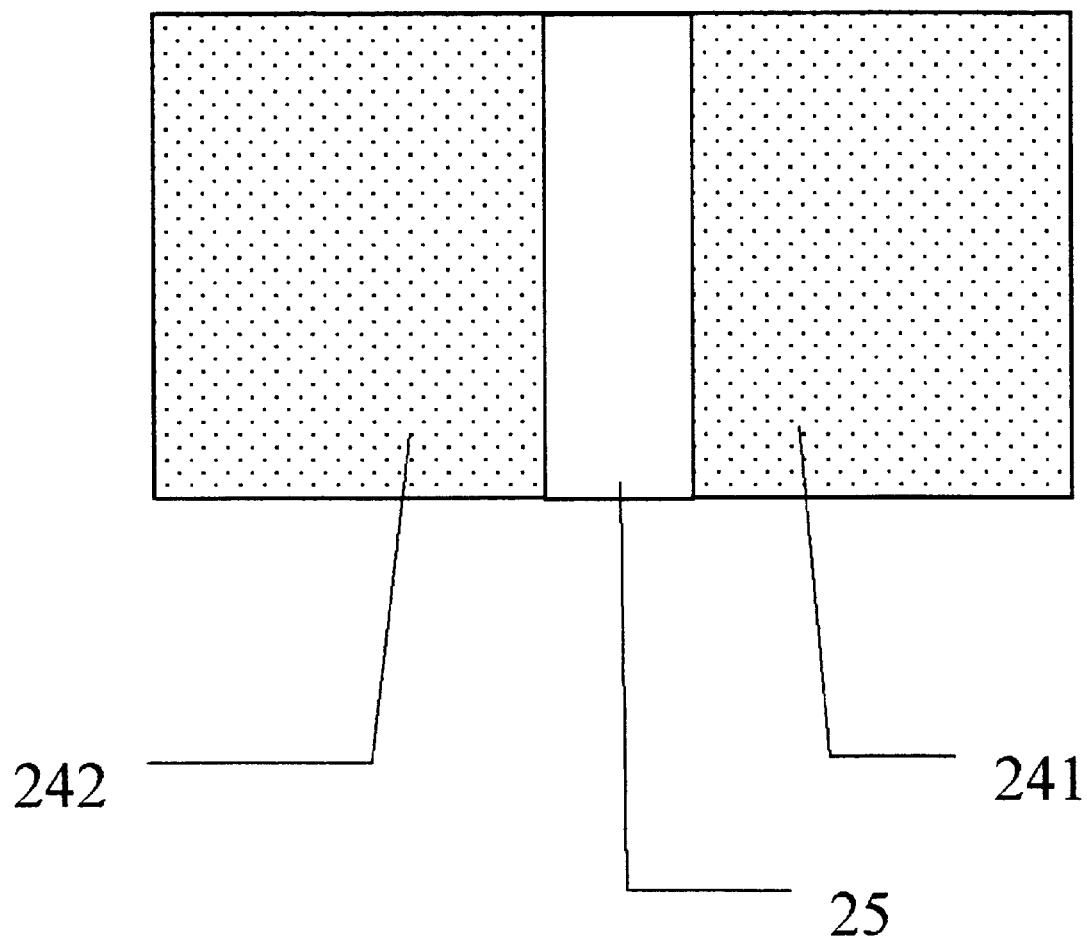
FIG. 5 shows the bottom view of FIG. 3.

FIG. 3 shows the basic structure of the present invention. A groove 26 is inscribed in an insulating substrate 25. FIG. 4 shows the side view of FIG. 3. The groove is lined with a metallic layer 21, which wraps around one side of the substrate 25 to form a bottom contact 242 for surface mounting. A LED chip 20 is mounted on the bottom of the groove 26 to make contact to the bottom electrode of the chip 20. The top electrode of the chip 20 is wire-bonded to a second metal plate 22, which wraps around another edge of the substrate 25 to form another bottom contact 241 for surface mounting. FIG. 5 shows the bottom view of FIG. 3.

Figure 6:
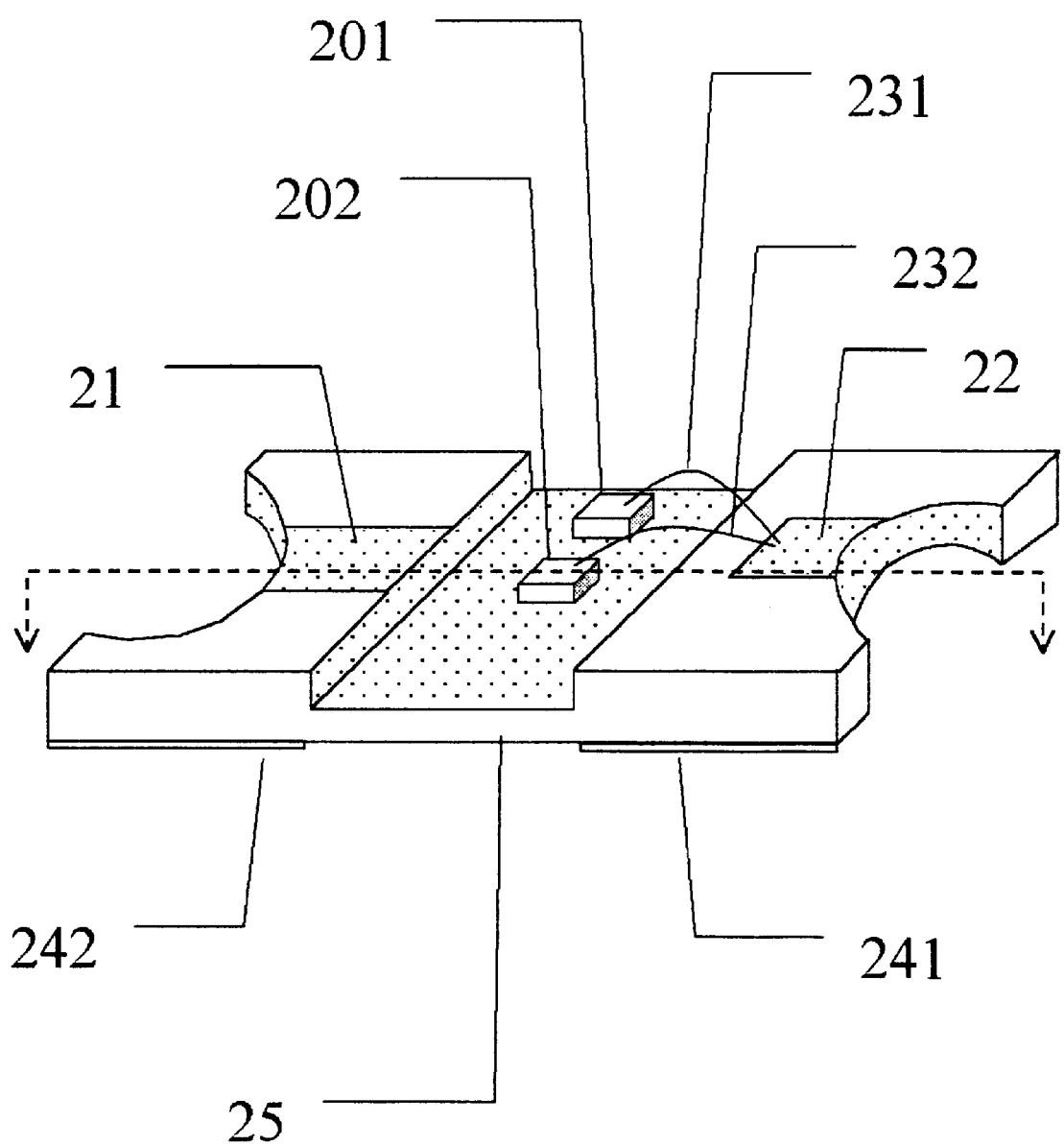
FIG. 6 shows the mounting of two LED chips on a grooved package.
Figure 7:
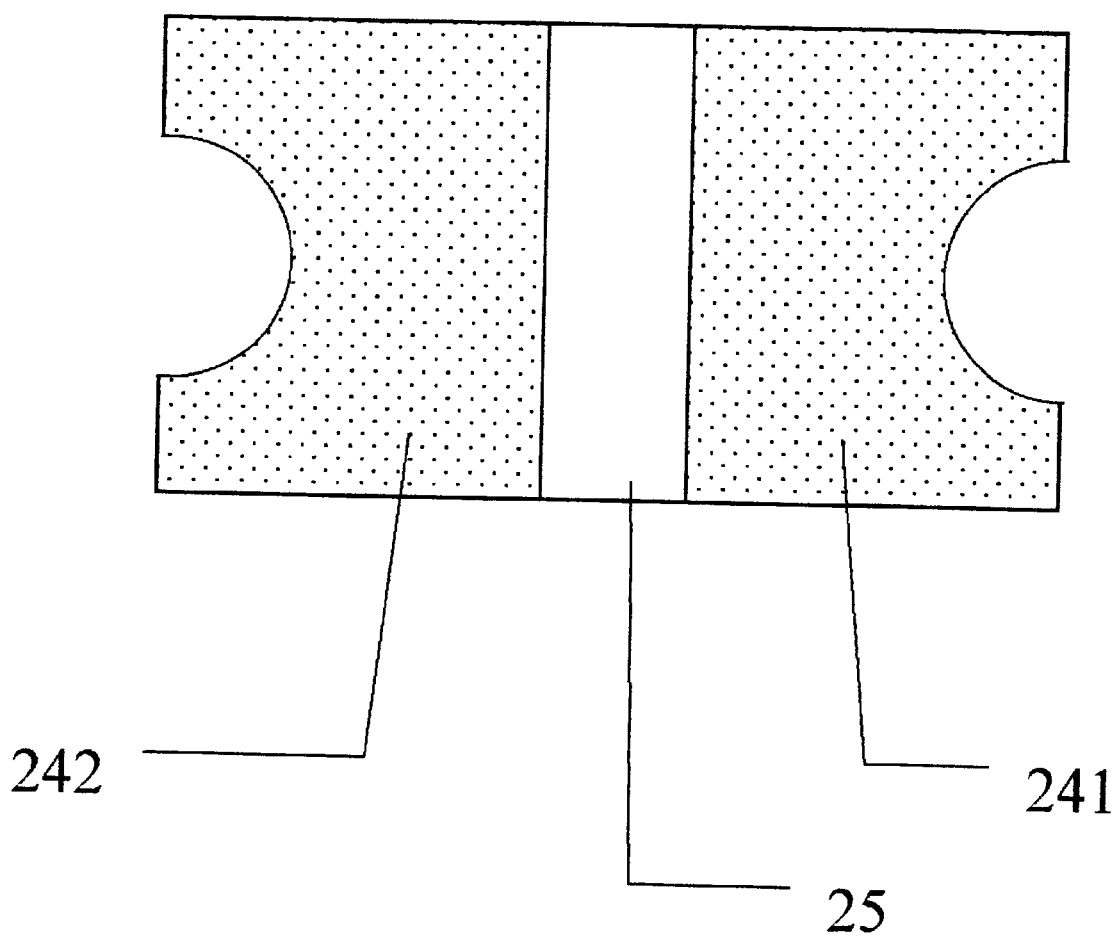
FIG. 7 shows the bottom view of FIG. 6.

FIG. 6 shows a second embodiment of the present invention for multiple chips in parallel connection. The two chips are aligned along the longitudinal direction of the groove and may emit same color light or different color lights. Two chips 201 and 202 are mounted in the groove similar to that described in FIG. 3. The bottom electrodes are in contact with the metallic layer 21, which wraps around a semicircular conduit in the substrate 25 to form a bottom contact 242 for surface mounting. The two top electrodes of chips 201 and 202 are wire-bonded to a common metal plate 22, which wraps around another semicircular conduit in the substrate 25 to form another bottom contact 241 for surface mounting. FIG. 7 shows the bottom view of FIG. 6, where two bottom contacts are placed side-by-side at the bottom of the substrate 25 for surface mounting to a motherboard.

Figure 8:
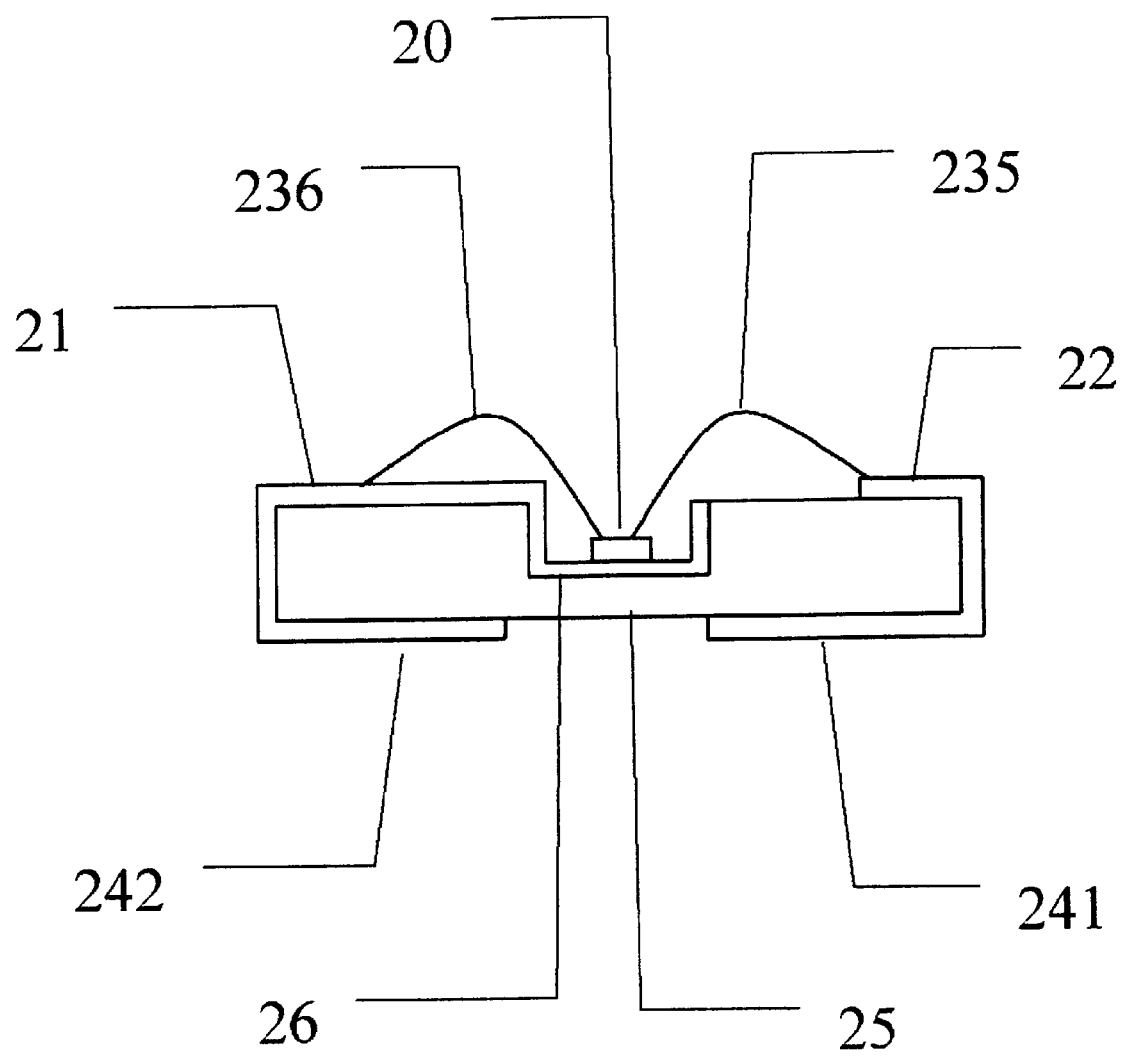
FIG. 8 shows wrapped around leads for surface mounting to a motherboard.

FIG. 8 shows a third embodiment of the present invention. The grooved structure is similar to that in FIG. 3. The LED has two top electrodes. One of the top electrodes is wire-bonded by wire 236 to the metal plate 21 with extension to the bottom contact 242 for surface mounting to a motherboard. Another top electrode of chip 20 is wire-bonded by wire 235 to the metal plate 22 with wrap-around extension to the bottom contact 241 for surface mounting to a motherboard.

Figure 9:
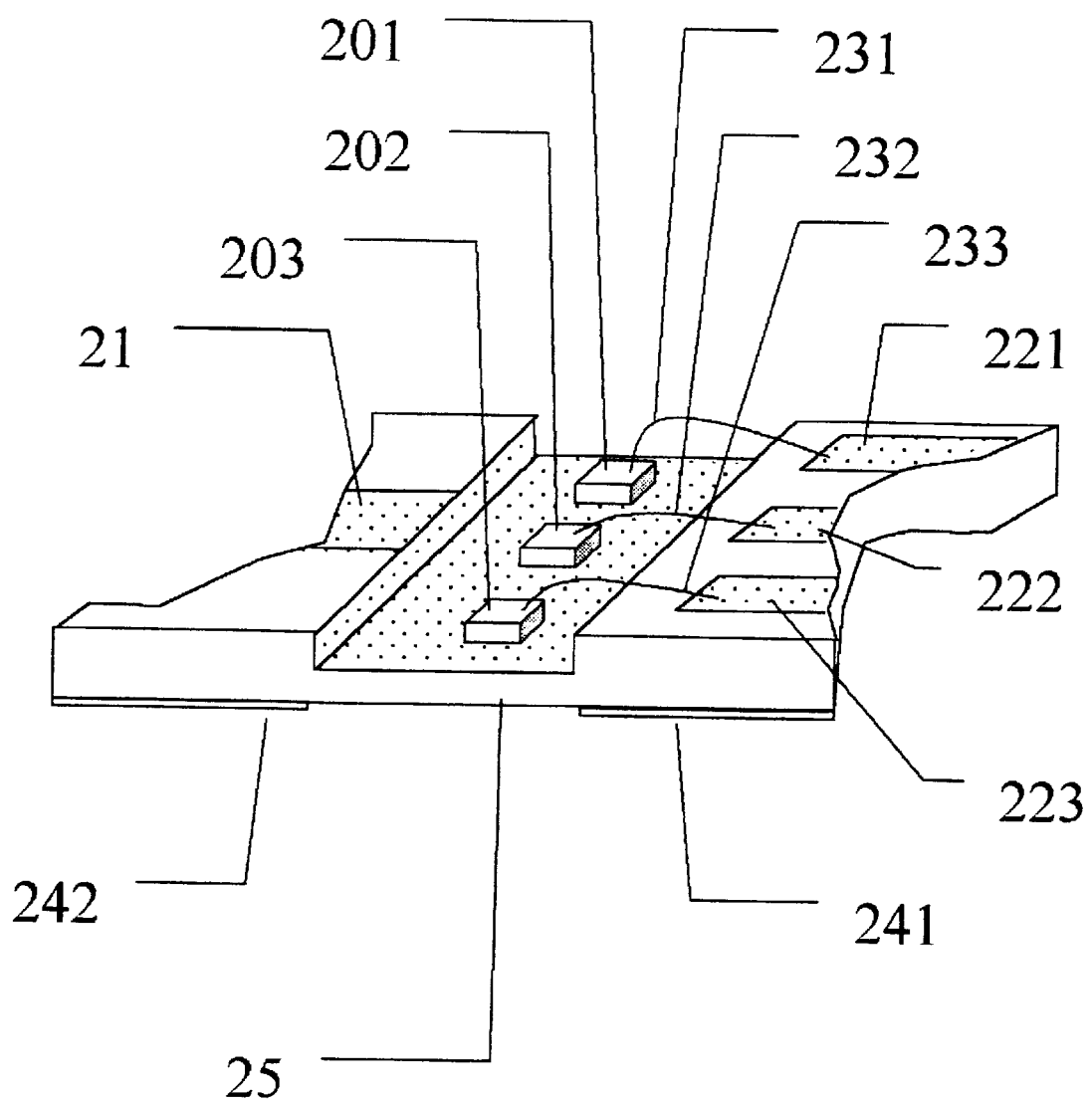
FIG. 9 shows lead connections of multiple LEDs with common bottom electrodes.

FIG. 9 shows a fourth embodiment of the present invention. Three LED chips 201, 202, 203 for different color light emission or same color light emission are mounted on the metal plate at the bottom of a groove. Each chip has a bottom electrode, which is in contact with the common metal plate 21 and wraps around to the bottom of the substrate to form a bottom contact for surface mounting to a motherboard. Th top electrodes of the chips 201, 202, 203 are wire-bonded respectively by wires 231, 232, 233 to separate metal plates 221, 222, 223, which wrap around the substrate 25 to form bottom contacts for surface mounting to a motherboard.

Figure 10:
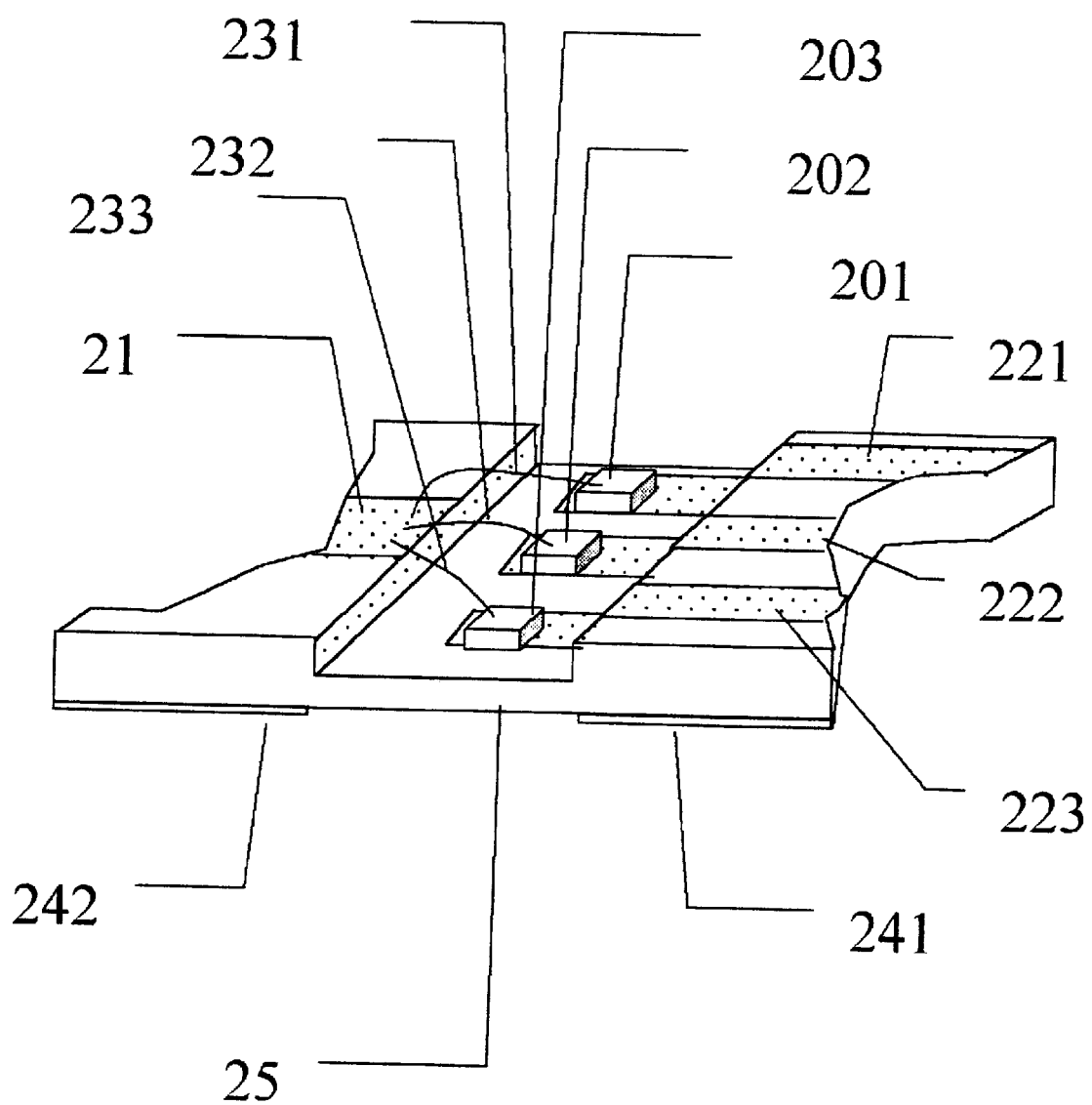
FIG. 10 shows lead connections of multiple LEDs with common top electrodes.

FIG. 10 shows a fifth embodiment of the present invention. The three LED chips 201, 202, 203 for different color emission have respect top electrodes wire-bonded by wires 231, 232, 233 to a common metal plate 21, which wraps around the substrate 25 to form a bottom contact 242 for surface mounting to a motherboard. The bottom electrodes of the chips 201, 202, 203 are in contact respectively with individual metal strips 221, 222, 223, which wrap around the substrate 25 to form bottom contacts 241 for surface mounting to a motherboard.

Figure 11:
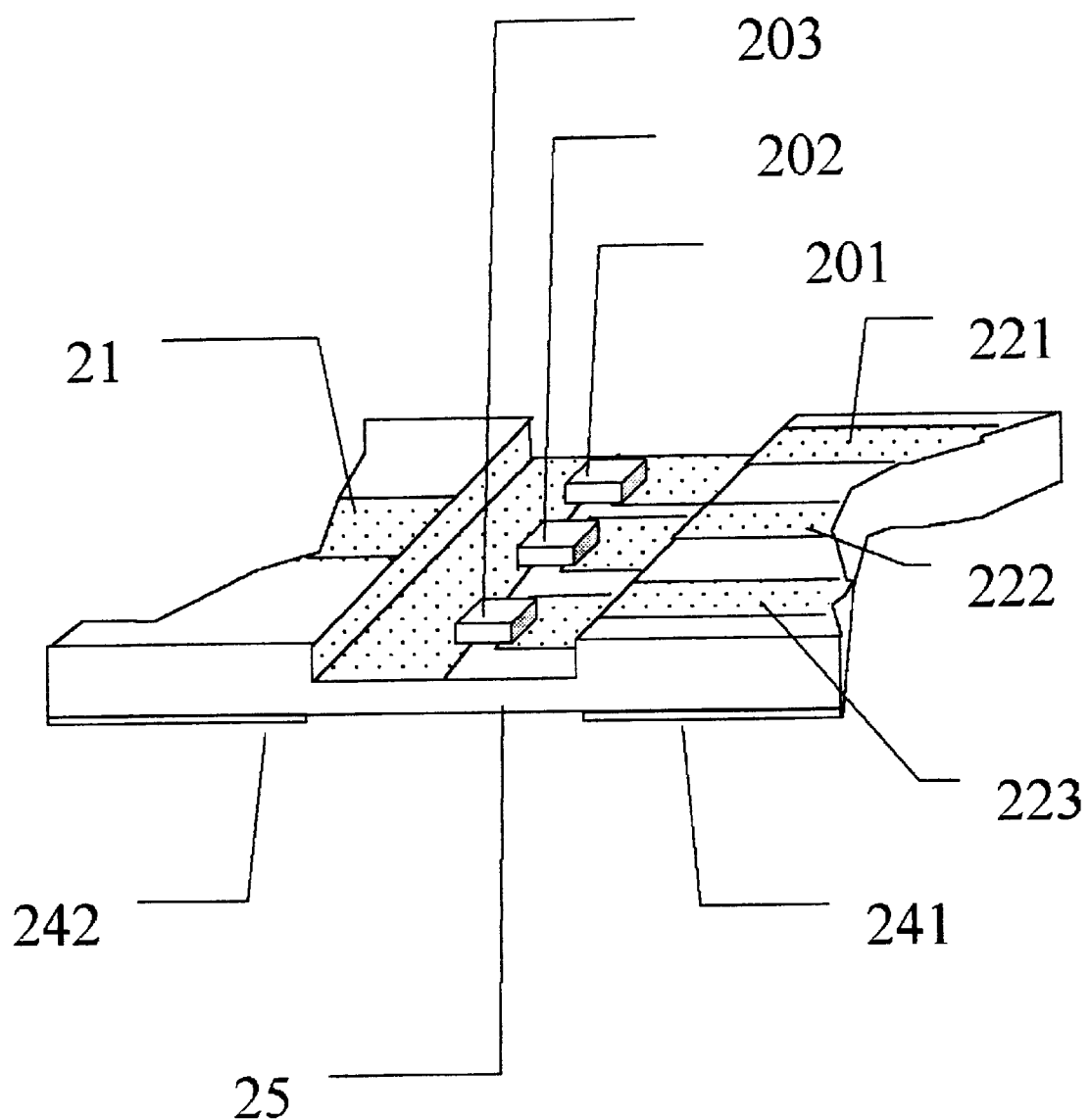
FIG. 11 shows lead connections of multiple LEDs with only bottom electrodes.

FIG. 11 shows a sixth embodiment of the present invention. The three LED chips 201, 202, 203 all have bottom electrodes. The common electrodes are in contact with the metal plate 21 in the groove, which wraps around to the bottom of the substrate to form contact for surface mounting to a motherboard. The other bottom electrodes of the chips 201, 202, 203 are in contact respectively with individual metal strips 221, 222, 223, which wrap around to the bottom of the substrate 25 to form contacts for surface mounting to a motherboard.

Figure 12:
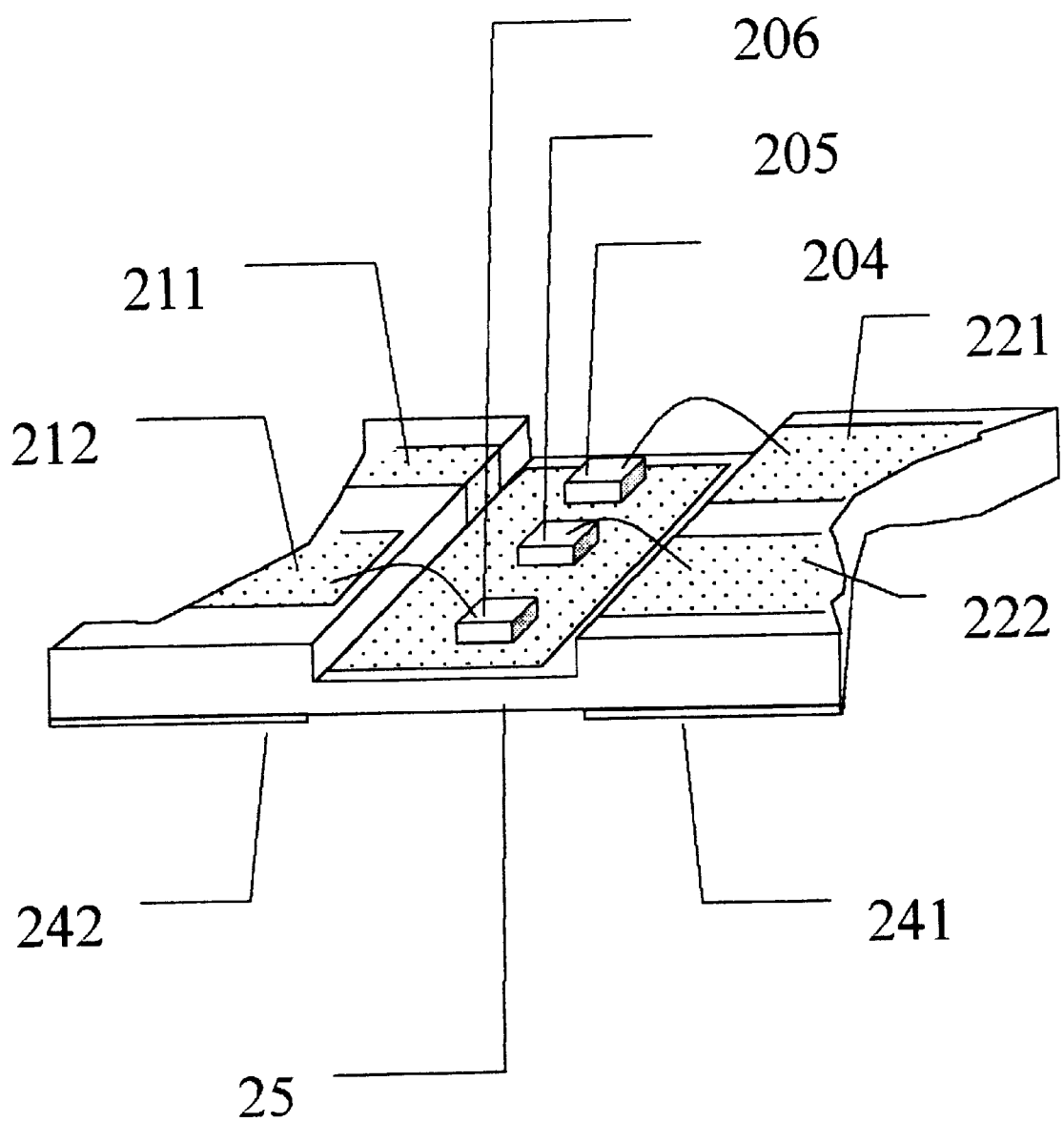
FIG. 12 shows lead connections of multiple LEDs with electrodes connected to leads alternately spaced at two side of the groove.

FIG. 12 shows a seventh embodiment of the present invention. The chips 204, 205, 206 are similar to the chips 201, 202, 203 in FIG. 9. However, the metal strip 212 for connection to the top electrode of chip 206 and the metal strips 221, 222 for connection to the top electrodes of chips 204, 205 respectively rest on opposite shoulders of the groove. The bottom electrodes of the chips 204, 205, 206 are in contact with the common metal plate 211, which wraps around the substrate to form a common bottom contact for surface mounting. The top electrode of the chips 204, 205 are wire-bonded to metal strips 221, 222 respectively, which wrap around to the bottom of the substrate 25 to form contacts 241 for surface mounting to a motherboard. The top electrode of the chip 206 is wire-bonded to a metal strip 212, which wraps around the substrate 25 to form a bottom contact 242 for surface mounting to a motherboard.

Figure 13:
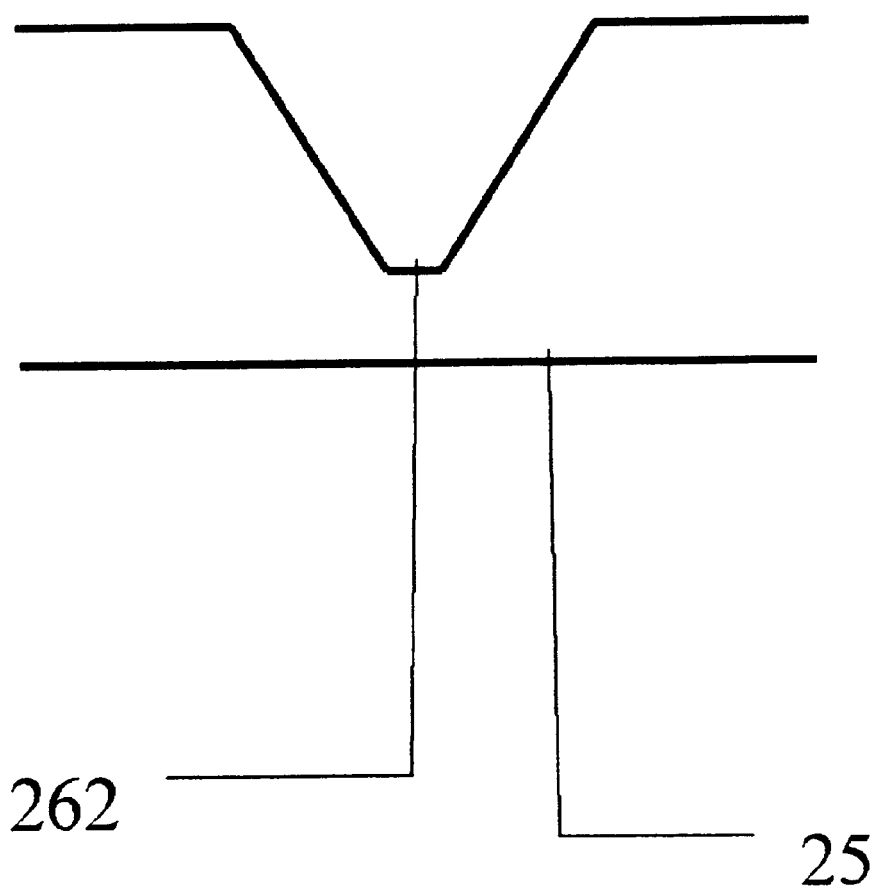
FIG. 13 shows the side view of a V-shaped groove.

FIG. 13 shows the cross-section of a V-shaped groove for the basic structure shown in FIG. 3.

Figure 14:
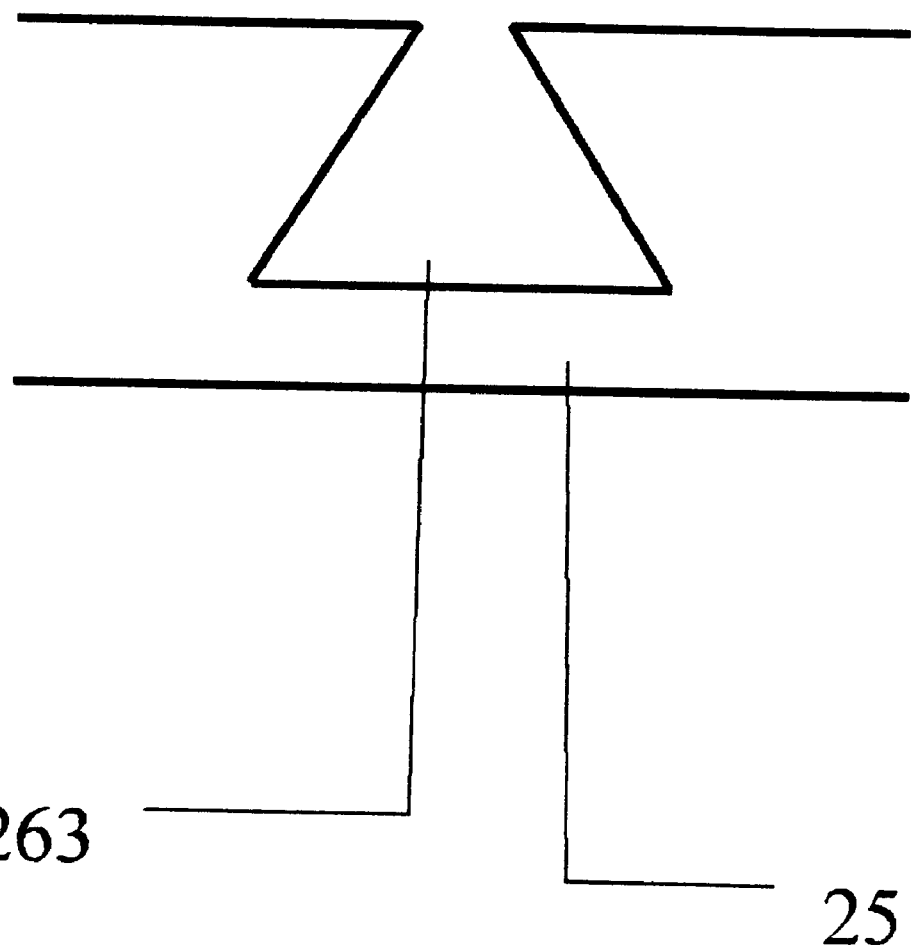
FIG. 14 shows the side view of an inverted V-shaped groove.

FIG. 14 shows the cross-section of an invented V-shaped groove for the basic structure shown in FIG. 3.

Figure 15:
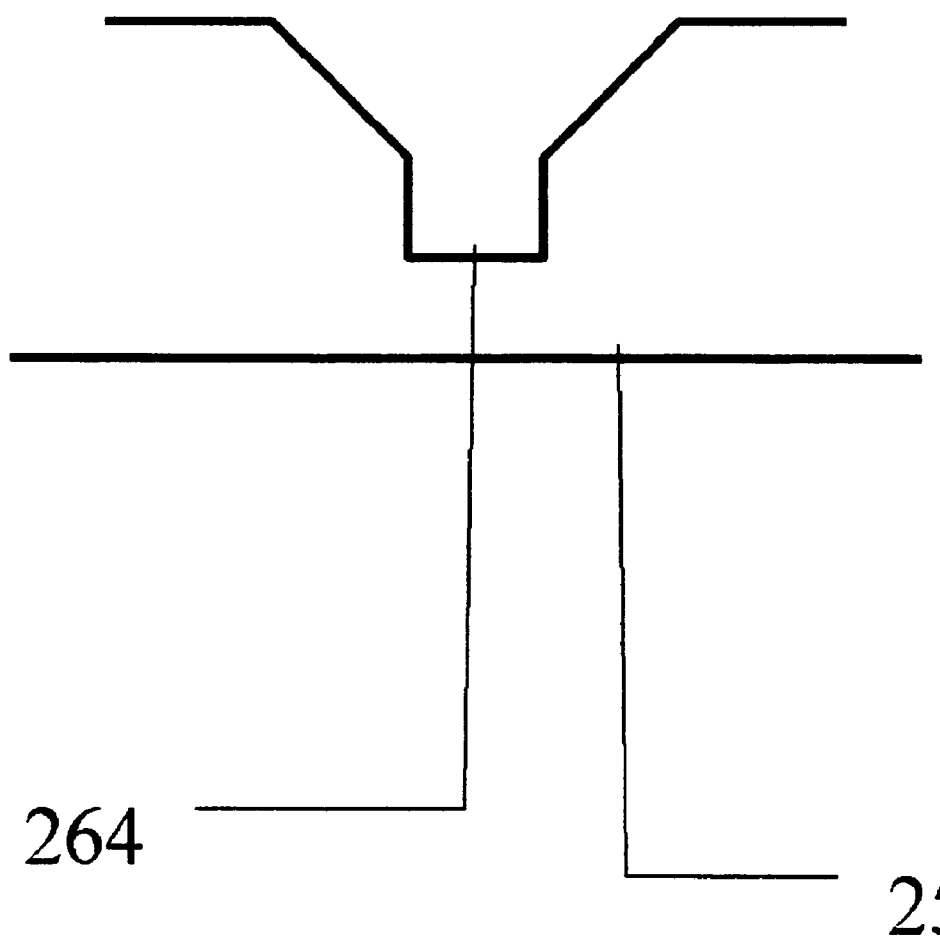
FIG. 15 shows the side view of a funnel-shaped groove.

FIG. 15 shows the cross-section of a funnel shaped groove for the basic structure shown in FIG. 3.

Figure 16:
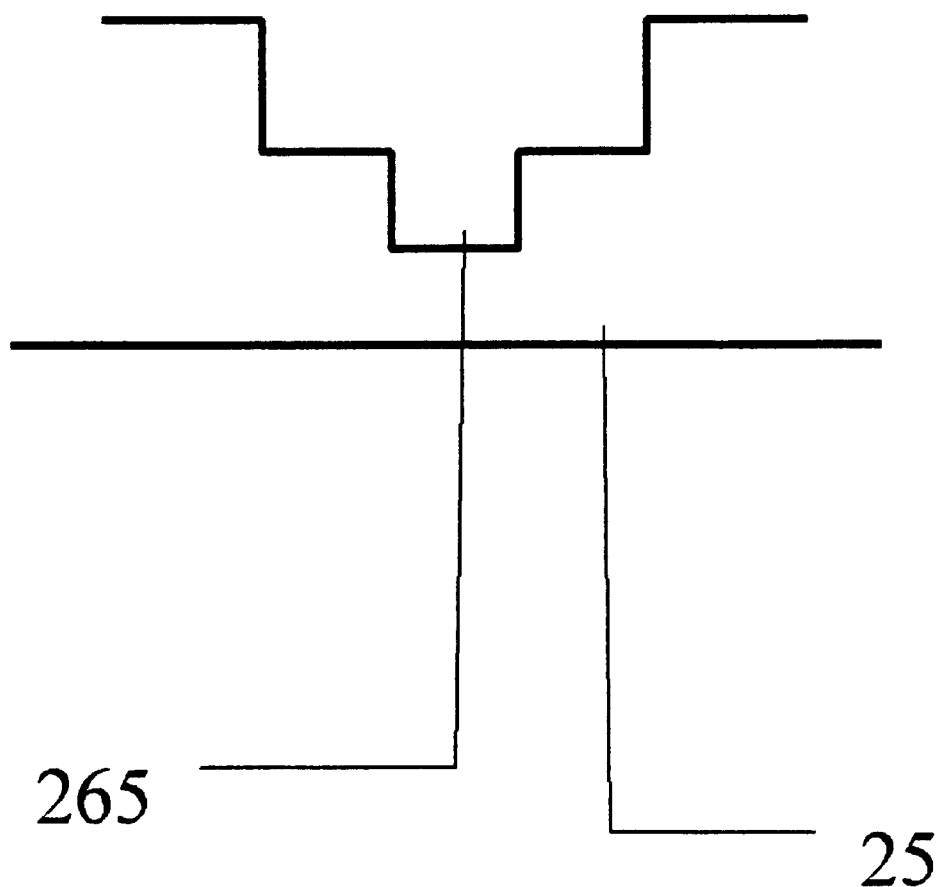
FIG. 16 shows the side view of a staircase-shaped groove.

FIG. 16 shows the cross-section of a staircase shaped groove for the basic structure shown in FIG. 3.

While the preferred embodiments of the invention have been described, it will be apparent to those skilled in the art that various modifications may be made in the embodiments without departing from the spirit of the invention. Such modifications are all within the scope of this invention.

What is claimed is:

1. A package for optoelectronic device, comprising:
    an insulating substrate;
    a groove cut in said insulating substrate;
    at least a first metal plate lining the bottom of said groove, extending over a first shoulder of said groove, and wrapping around said substrate to form a first bottom contact for surface mounting to a motherboard;
    more than one optoelectronic chip within the groove, having at least one electrode connected with said metal plate, and
    at least a second metal plate connected with a second electrode of said chip, extending over a second shoulder of said groove, and wrapping around said substrate to form a second bottom contact for surface mounting to said motherboard.

2. The package as described in claim 1, wherein said more than one chips emit different color light when activated.

3. The package as described in claim 1, wherein said more than one chips emit same color light when activated.

4. The package as described in claim 1, wherein two said chips are connected in parallel electrically, each having a bottom electrode in contact with said first metal plate and a top electrode wire-bonded to said second metal plate.

5. The package as described in claim 4, further comprising a third metal plate extending over said second shoulder of said groove and wire-bonded to the top electrode of a second said chip and fourth metal plate extending over said second of said groove and wire-bonded to the top electrode of a third said chip, said second chip and said third chip having bottom electrodes in contact with said first metal plate.

6. The package as described in claim 4, further comprising a third metal plate extending over second shoulder of said groove and in contact with the bottom electrode of a second said chip, and a fourth metal plate extending over second shoulder and in contact with the bottom electrode of a third said chip, said second chip and said third chip having top electrodes wire-bonded to said second metal plate.

7. The package as described in claim 1, wherein a first said chip has a first bottom electrode contacting said first metal plate and a second bottom electrode contacting said second metal plate, further comprising:
    a third metal plate extending over the second shoulder of said groove and in contact with the bottom electrode of a second said chip,
    a fourth metal plate extending over the second shoulder of said groove and in contact with the bottom electrode of a third said chip, and
    said second bottom electrode of said second chip and said second bottom electrode of said third chip in contact with the first metal plate.

8. The package as described in claim 6, wherein said third metal plate are placed over said first shoulder and said fourth metal plate are placed over said second shoulder.

* * * * *